(12) United States Patent
Basker et al.

(10) Patent No.: US 7,944,006 B2
(45) Date of Patent: May 17, 2011

(54) METAL GATE ELECTRODE STABILIZATION BY ALLOYING

(75) Inventors: Veeraraghavan S. Basker, Yorktown Heights, NY (US); Hariklia Deligianni, Tenafly, NJ (US); Rajarao Jammy, Hopewell Junction, NY (US); Vamsi Krishna Paruchuri, New York, NY (US); Lubomyr T. Romankiw, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 12/014,511

(22) Filed: Jan. 15, 2008

(65) Prior Publication Data

US 2009/0179279 A1    Jul. 16, 2009

(51) Int. Cl.
*H01L 29/78* (2006.01)

(52) U.S. Cl. .................. 257/412; 257/388; 257/E29.158
(58) Field of Classification Search .................. 257/388, 257/E29.158, 412
See application file for complete search history.

(56) References Cited

U.S. PATENT DOCUMENTS

| | | | |
|---|---|---|---|
| 6,188,120 B1* | 2/2001 | Andricacos et al. | 257/532 |
| 6,873,048 B2* | 3/2005 | Gao et al. | 257/750 |
| 6,967,131 B2* | 11/2005 | Saenger et al. | 438/199 |
| 2005/0037557 A1* | 2/2005 | Doczy et al. | 438/197 |
| 2006/0166474 A1* | 7/2006 | Vereecken et al. | 438/584 |
| 2007/0190767 A1* | 8/2007 | Nakamura et al. | 438/592 |
| 2008/0102613 A1* | 5/2008 | Elers | 438/584 |

* cited by examiner

*Primary Examiner* — Jerome Jackson, Jr.
*Assistant Examiner* — Paul A Budd
(74) *Attorney, Agent, or Firm* — Connolly Bove Lodge & Hutz LLP; Louis J. Percello

(57) ABSTRACT

Stabilized metal gate electrode for complementary metal-oxide-semiconductor ("CMOS") applications and methods of making the stabilized metal gate electrodes are disclosed. Specifically, the metal gate electrodes are stabilized by alloying wherein the alloy comprises a metal selected from the group consisting of Re, Ru, Pt, Rh, Ni, Al and combinations thereof and an element selected from the group consisting of W, V, Ti, Ta and combinations thereof.

14 Claims, 5 Drawing Sheets

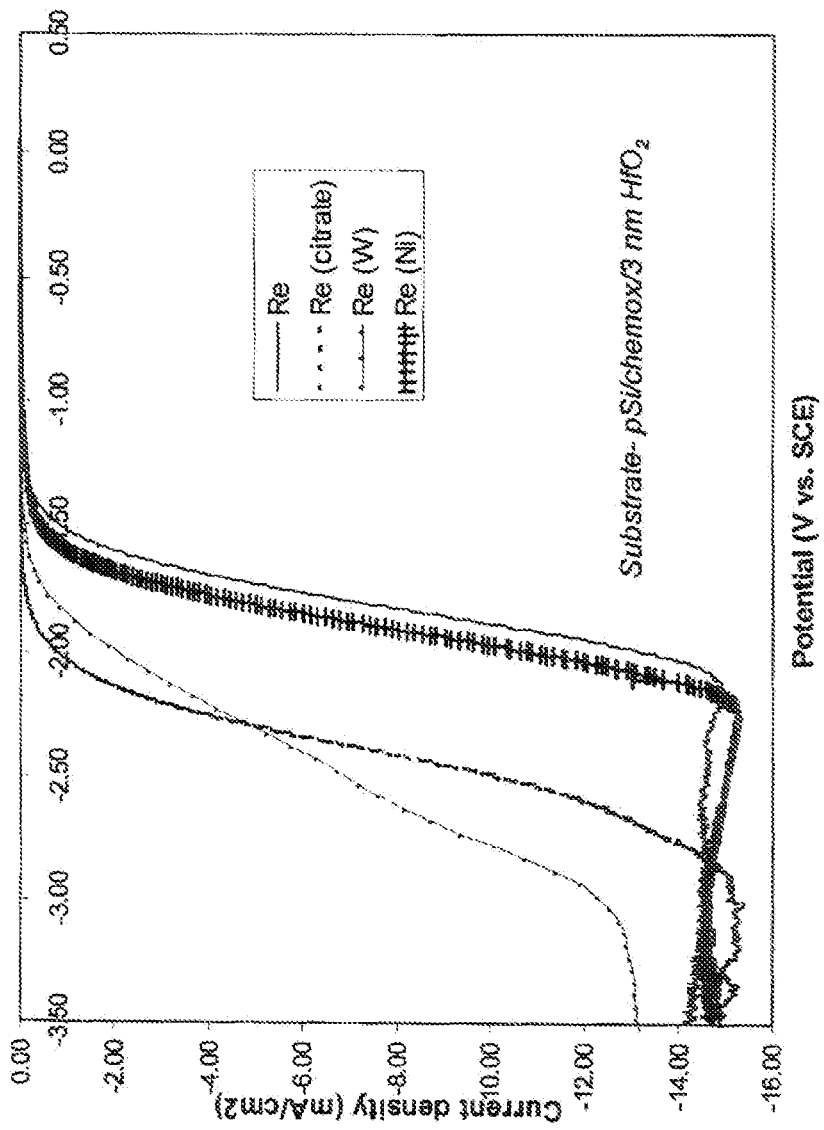

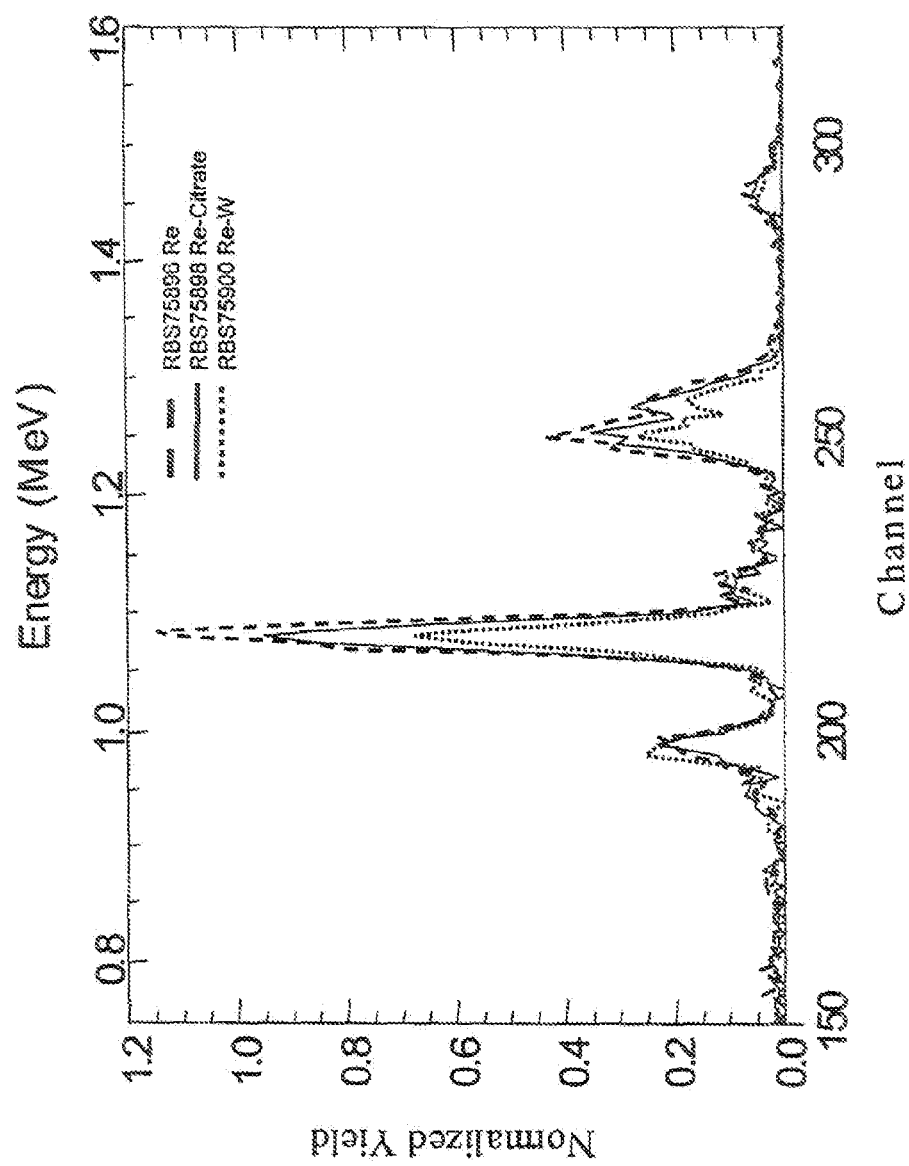

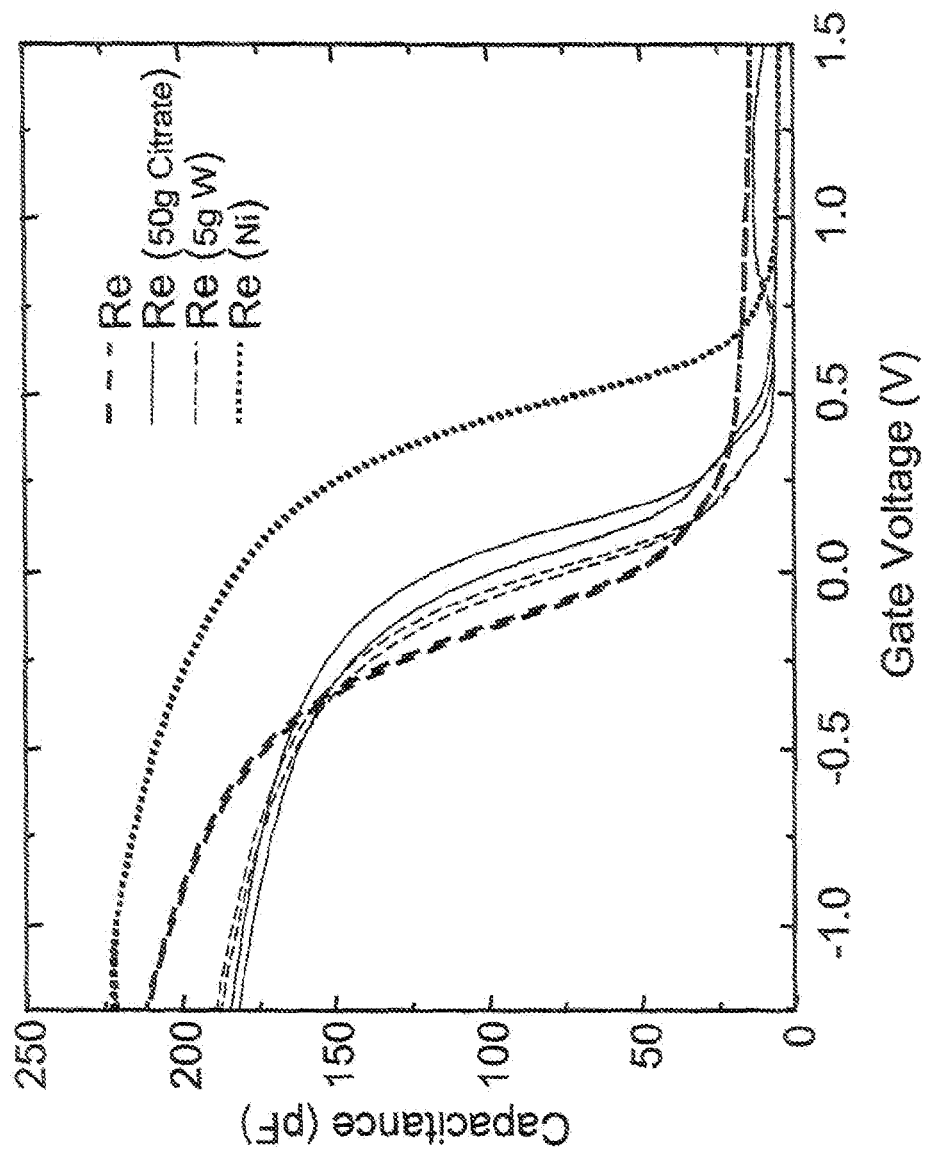

CV curves of Re as a function of temperature

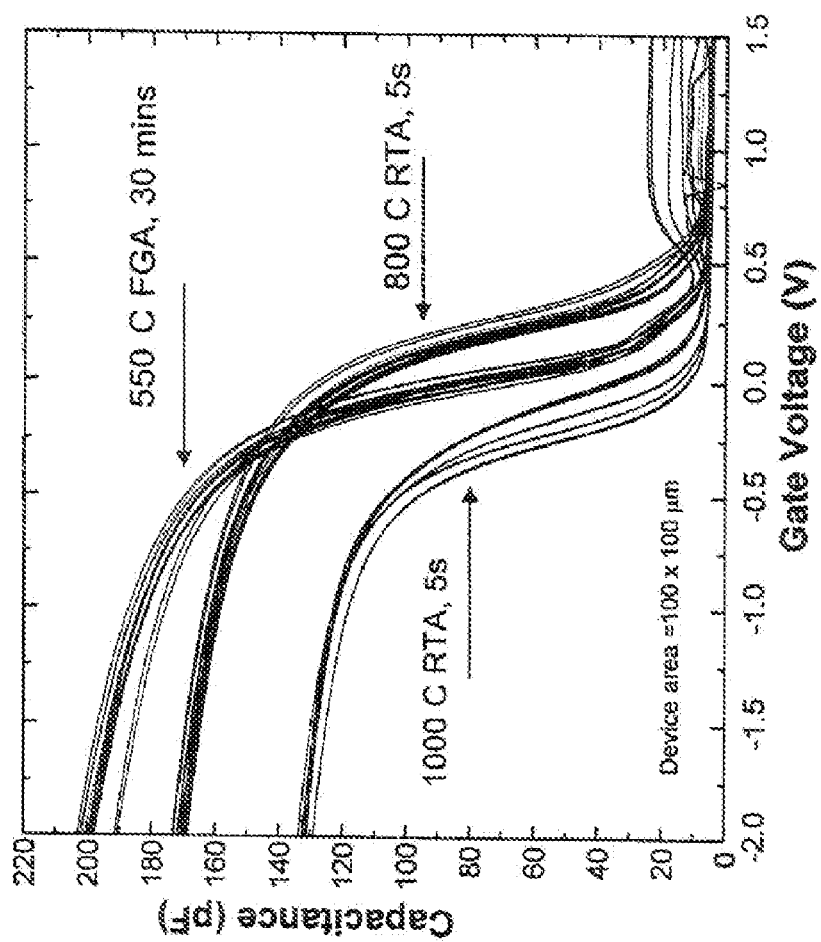

METAL GATE ELECTRODE STABILIZATION BY ALLOYING

TECHNICAL FIELD

The present disclosure relates generally to the stabilization of metal gate electrodes. In particular, it relates to a stabilized metal gate electrode by alloying for complementary metal-oxide-semiconductor ("CMOS") applications and methods of making the stabilized metal gate electrodes.

BACKGROUND

A common trend in modern integrated circuit manufacturing is to produce transistors having very small feature sizes. For competitive high density integrated circuits, features such as the conductors, source and drain junctions, and interconnections to the junctions must be made as small as possible. As feature sizes decrease, the sizes of the resulting transistors and the interconnections between transistors also decrease. Smaller transistors allow more transistors to fit on a single substrate. Furthermore, smaller transistors usually have lower turn on threshold voltages and taster switching speeds and consume less power in their operation. These features allow for higher speed integrated circuits.

As semiconductor transistors become smaller, a number of problems have arisen. For instance, use of a very thin gate dielectric causes high gate current leakage, which diminishes device performance. Also, a higher doping level is needed in the channel to reduce short channel effect in order to ensure that the transistor properly turns off. Using a very high concentration of dopant in the channel decreases current drive and can lead to undesirable drain-to-channel tunneling current.

Polysilicon gate technology, which is often employed, carries with it additional problems. For example, polysilicon gates tend to suffer from polysilicon depletion or boron penetration effects, causing poor performance. Additionally, a polysilicon gate has a fixed work function determined by a certain high level of doping.

Metal is another material used for gate electrodes. Metal has a variety of advantages over polysilicon as a gate electrode material. For example, metal allows for excellent current flow and has less voltage depletion problems than polysilicon. Metal too, however, has its own drawbacks. Some metals, like Ti and Ni, are highly diffusive and act as contaminants within the channel region, particularly during the high temperature conditions required for dopant activation of the source/drain implant. Also, certain work functions are required that allow transistors to work optimally, and it is more difficult to manipulate the work function of metals than it is to manipulate the work function of polysilicon. Moreover, metals are difficult to etch properly. Dry-etch methods are too harsh on underlying Si substrates while wet-etch methods can excessively undercut the sidewalls of the gate electrode.

Methods to solve some of these problems have been attempted by combining the conventional methods of forming the transistor with polysilicon as the gate electrode during doping with the additional steps of completely etching out the polysilicon after doping and replacing it with a metal. This replacement process, however, is complex and can often result in costly errors if not done properly.

BRIEF SUMMARY OF THE DISCLOSURE

The present disclosure is drawn to the stabilization of metal gate electrodes by alloying for complementary metal-oxide-semiconductor ("CMOS") applications and methods of making the stabilized metal gate electrodes. Modern silicon CMOS transistors require the use of metal gate electrodes with high-k dielectrics such as $HfO_2$. These electrodes must be electrically stable and able to withstand the high temperatures required during manufacturing. The present disclosure is drawn to a field-effect transistor having a gate electrode comprising a metal selected from the group consisting of Re, Ru, Pt, Rh, Ni, Al and combinations thereof and an element selected from the group consisting of W, V, Ti, Ta and combinations thereof.

Typically, the metal gate electrode has a work-function greater than or equal to the metal or combination of metals wherein the work-function is calculated by the following formula $$\phi_m = 4.6 + V_{FB} \pm kT\ln\left(\frac{N_a}{n_i}\right)$$

such that,
$V_{FB}$ is the flat band voltage of the metal;
kT is 0.0259 eV;
$n_i = 1.45 \times 10^{10}$;
and $N_a$ is the doping density of the silicon substrate.

Besides a Si substrate, any semiconductor substrate may be used including SiGe, Ge or GaAs with appropriate adjustments to the above formula for the work-function.

The metal gate electrodes typically comprise an alloying compound or combination of alloying compounds present in an amount of 0.1% to about 25%, about 0.1% to about 15%, or about 0.1% to about 10% by weight. In one embodiment the alloying compound of the metal gate electrodes is W at a concentration of about 4% to about 9% by weight, or the alloying compound of the metal gate electrodes is Ni at a concentration of about 0.1% to about 2.5% by weight, or the alloying compound of the metal gate electrodes is C at a concentration of about 2% to about 6.5% by weight.

The present disclosure is also drawn to methods of making a stabilized metal gate electrode comprising the steps of forming a metal gate electrode pattern comprising a metal selected from the group consisting of Re, Ru, Pt, Rh, and combinations thereof and an alloying compound selected from the group consisting of Ni, Y, Ti, Ta, W, C, Al, and combinations thereof; and subjecting the metal gate electrode pattern to a forming gas anneal. The forming gas provides an environment for forming alloys and can also serve to passivate the dielectric layer on the metal gate electrode. Typically, the forming gas anneal is conducted at a temperature of about 300° C. to about 1000° C., of at a temperature of about 450° C. to about 650° C.

In one embodiment, the method is drawn to making a metal gate electrode having a work-function greater than or equal to the metal or combination of metals wherein the work-function is calculated by the following formula $$\phi_m = 4.6 + V_{FB} \pm kT\ln\left(\frac{N_a}{n_i}\right)$$

such that,
$V_{FB}$ is the flat band voltage of the metal or combination of metals;
kT is 0.0259 eV;
$n_i = 1.45 \times 10^{10}$;
and $N_a$ is the doping density of the silicon substrate.

Typically, the metal gate electrodes are formed in baths used for electrochemically depositing the metal and the alloying compound onto a substrate. The baths provide small quantities of alloying compounds, which stabilize the electrical properties of the gate metal while not adversely affecting its work-function. For instance, the alloying compound W may be deposited onto a wafer in a bath comprising from about 1 g/L to about 50 g/L, or from about 1 g/L to about 20 g/L of a W salt. Examples of W salts include Sodium tungstate and Ammonium tungstate. Additionally, the bath may further comprise from about 1 to about 50 g/L of sodium citrate. The alloying compound Ni may be deposited onto a wafer in a bath comprising from about 1 g/L to about 50 g/L, or from about 1 to about 20 g/L of a Ni salt. Examples of Ni salts include Nickel sulfate, Nickel chloride or Nickel sulfamate. The alloying compound C may be deposited onto a wafer in a bath comprising from about 5 g/L to about 500 g/L or from about 25 g/L to about 100 g/L of sodium citrate. Furthermore, the baths used for electrochemically depositing the metal and the alloying compound onto a substrate may optionally include a strong acid, such as hydrochloric acid, in concentrations from about 1 mL/L to about 100 mL/L or about 1 mL/L to about 50 mL/L or about 5 mL/L to about 25 mL/L.

BRIEF DESCRIPTION OF THE DRAWINGS

FIG. 1 shows the electrochemical curves obtained by various rhenium alloy deposition baths.

FIG. 2 shows the Micro Rutherford back scattering analysis of Re, Re—C, and Re—W.

FIG. 3 shows the capacitance-voltage characteristics of electrodeposited Re and Re alloys.

FIG. 4b presents the capacitance-voltage curves of Re—W alloy as a function of temperature.

DETAILED DESCRIPTION OF THE DISCLOSURE

Figure 4A:
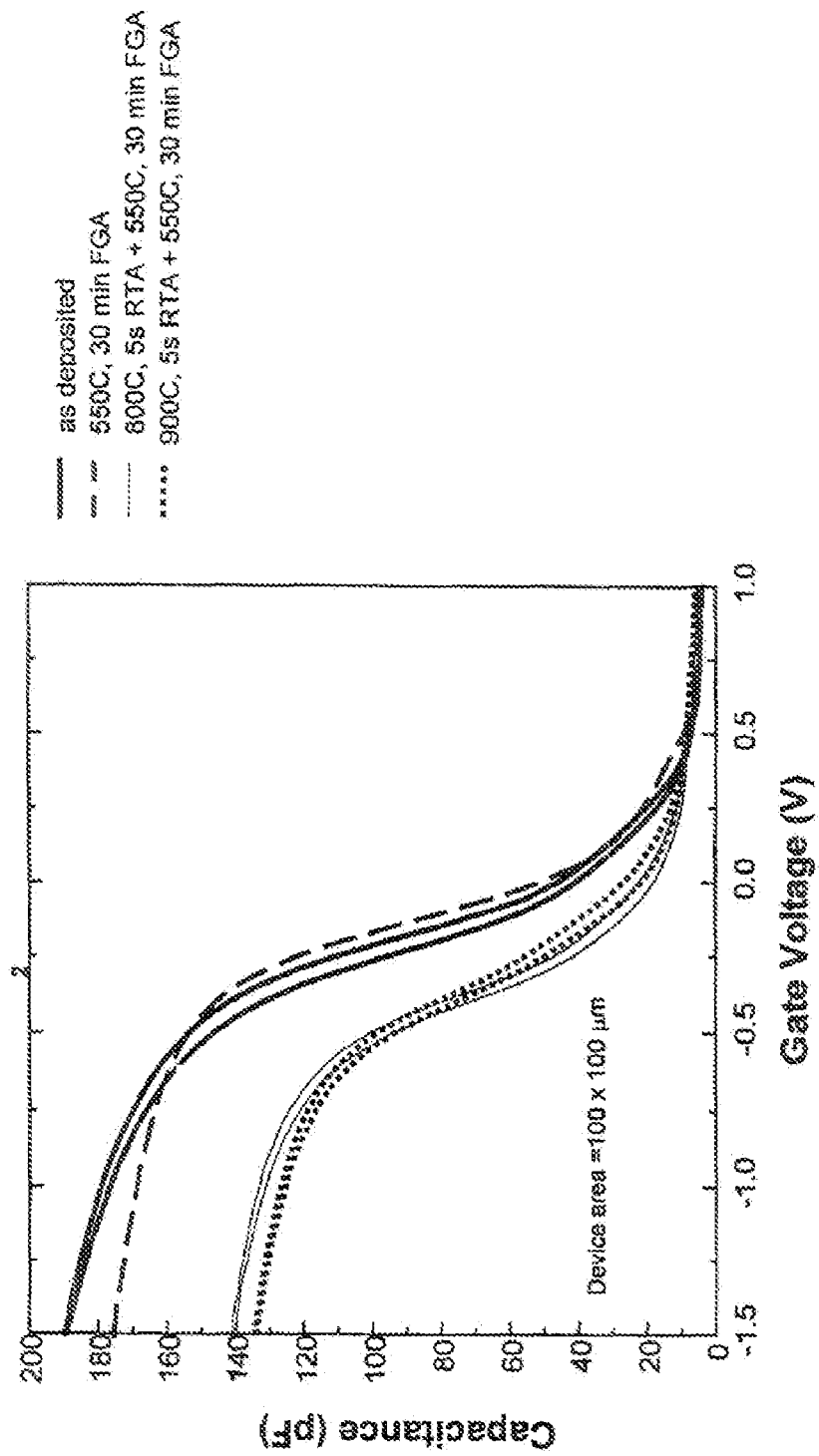
FIG. 4a presents the capacitance-voltage curves of Re as a function of temperature.

The present disclosure is drawn to field-effect transistors having a gate electrode comprising a metal selected, from the group consisting of Re, Ru, Pt, Rh, Ni, Al and combinations thereof and an element selected from the group consisting of W, V, Ti, Ta and combinations thereof.

FIG. 1 gives the electrochemical curves obtained by various rhenium alloy deposition baths. The curves were obtained by sweeping the potential cathodically with respect to an open circuit potential. The substrate used was a blanket p-Si/10 Å chemox/30 Å $HfO_2$ substrate. Since light is typically used to generate electrons in the case of p-Si, all curves were obtained under illumination. White composite light was used for this purpose. Since electrons are generated by light, the limiting currents seen in all the baths under high overpotentials are determined by the intensity of the incident light. The figure shows that the Re-alloys all have higher activation potentials than Re alone.

FIG. 2 shows the Micro Rutherford back scattering ("RBS") analysis of the various alloys which spectroscopically confirms the presence of the various elements. The RBS analysis also detects the presence of Hf, which is present as part of the $HfO_2$ layer below the deposited layer of metal/metal alloy film. These spectra allow quantitative amounts of each element of the deposited film to be calculated, which are shown in Table 2.

FIG. 3 shows the capacitance-voltage characteristics of electrodeposited Re and Re alloys on a bulk p-Si/10 Å $SiO_2$/30 Å $HfO_2$ stack MOS test structures (100 µm×100 µm). The measurements were made after the samples were exposed to a 550° C. forming gas anneal for 30 minutes. For comparison, another sample was plated with Re (not an alloy of Re). The Re sample was also fabricated on p-Si/10 Å $SiO_2$/30 Å $HfO_2$.

Plotting CV curves of Re and comparing them to the CV curves of the Re-alloys allows one to determine whether the alloy can successfully be used as a metal gate electrode. Elements and/or alloys that destroy the electrical characteristics of the base metal are not typically used as a metal gate electrode.

To evaluate the effect of alloying on the electrical properties of Re, capacitance-voltage characteristics of the alloy films were obtained. The CV curves were used to calculate the work-function of a metal gate electrode by measuring the flat band voltage ($V_{FB}$) of the metal. Once $V_{FB}$ is determined, the work-function of the metal $\phi_m$ can be calculated by the following formula:

$$\phi_m = 4.6 + V_{FB} \pm kT\ln\left(\frac{N_a}{n_i}\right)$$

where kT=0.0259 eV, $n_i$=1.45×10$^{10}$ and $N_a$ is the doping density of the silicon substrate used for die test. For p-Si, the kT sign is positive and n-Si, it is negative. The work function of electrodeposited Re was 5.2 eV. If, for example, an alloy shifted the work-function to 4.6 eV (the mid-gap of Si transistors), then that alloy could not be used as a metal gate electrode. The CV curves of Re-citrate, Re—W and Re—Ni all have work-functions greater than or equal to 5.2 eV. The work function of Re is 5.15 eV. The work function for Re—C is 5.25 eV. The work function for Re—W and Re—Ni is 5.30 eV and 5.50 eV respectively.

FIGS. 4a and 4b compare the electrical properties of electrodeposited Re and Re—W alloy as a function of annealing temperature. Typically, Re metal electrodeposited using a backside contact scheme shows band edge work-function (5.2 eV) for use as metal gate electrode. However, when the metal gate stack is annealed at higher temperature, the work-function shifts as shown in FIG. 4a. Hence, Re is alloyed with W in order to stabilize its electrical properties. FIG. 4b shows that Re alloyed with W exhibit stable work-function even after exposing it to 1000° C. annealing. The Re—W alloy did not have a protective cap layer of TiN). However, work-function of Re metal shifts towards midgap even when protected with a cap layer of TIN. This result shows that Re—W exhibit more stable properties than Re metal alone.

The metal gate electrodes of the present invention typically comprise an alloying compound or combination of alloying compounds present in an amount of 0.1% to about 25%, about 0.1% to about 15%, or about 0.1% to about 10% by weight. In one embodiment the alloying compound of the metal gate electrodes is W at a concentration of about 4% to about 9% by weight, or the alloying compound of the metal gate electrodes is Ni at a concentration of about 0.1% to about 2.5% by weight, or the alloying compound of the metal gate electrodes is C at a concentration of about 2% to about 6.5% by weight.

The present disclosure provides methods of making a stabilized metal gate electrodes comprising the steps of forming a metal gate electrode pattern comprising a metal selected from the group consisting of Re, Ru, Pt, Rh, and combinations thereof and an alloying compound selected from the group consisting of Ni, Y, Ti, Ta, W, C, Al, and combinations thereof; and subjecting the metal gate electrode pattern to a forming gas anneal. The forming gas not only provides an environment for forming alloys but can also serve to passivate the dielectric layer on the metal gate electrode. Typically, the forming gas anneal is conducted at a temperature of about 300° C. to about 1000° C., or at a temperature of about 450° C. to about 650° C. Some alloying compounds such as Ni are electrochemically deposited onto the substrate. Thus, for an Re—Ni alloy metal gate, it maybe necessary to limit the amount of Ni deposited in the alloy as to not eliminate the desired electrical properties of Re metal.

Typically, the metal gate electrodes of the present disclosure are formed in baths used for electrochemically depositing the metal and the alloying compound onto a substrate. The baths provide small quantities of alloying compounds, which stabilize the electrical properties of the gate metal while not adversely affecting its work-function. For instance, the alloying compound W may be deposited onto a wafer in a bath comprising from about 1 g/L to about 50 g/L, or from about 1 g/L to about 20 g/L of a W salt. Additionally, the bath may further comprise from about 1 to about 10 g/L of a tungstate salt. The alloying compound Ni may be deposited onto a wafer in a bath, comprising from about 1 g/L to about 50 g/L, or from about 1 to about 20 g/L of a Ni salt. The alloying compound C may be deposited onto a wafer in a bath comprising from about 5 g/L to about 500 g/L or from about 25 g/L to about 100 g/L of sodium citrate.

TABLE 1

Electroplating Baths for Re Alloys

| | Re | Re—C | Re—W | Re—Ni |
|---|---|---|---|---|
| Ammonium perrhenate (g/L) | 10 | 10 | 10 | 10 |
| Hydrochloric acid (mL/L) | 10 | 10 | 10 | 10 |
| Sodium citrate (g/L) | — | 50 | 10 | — |
| Ammonium tungstate (g/L) | — | — | 5 | — |
| Nickel chloride (g/L) | — | — | — | 10 |

Table 1 lists the baths used for depositing rhenium alloys. The baths provide small quantities of alloying elements, which stabilize the electrical properties of the gate metal while not adversely affecting its work-function.

TABLE 2

Elemental Analysis of Re Alloys

| Sample | Thickness (Å) | Re (at %) | W (at %) | Ni (at %) | O (at %) | C (at %) | Hf (at %) |
|---|---|---|---|---|---|---|---|
| Re | 74 ± 10 | 51.0 ± 1 | 0 ± 1 | 0 ± 0.2 | 33.6 ± 3 | 0 ± 3 | 12.5 ± 1 |
| Re (C) | 67 ± 10 | 34.5 ± 1 | 0 ± 1 | 0 ± 0.2 | 30.1 ± 3 | 24.1 ± 3 | 10.5 ± 1 |
| Re—W | 47 ± 10 | 31.1 ± 1 | 2.2 ± 1 | 0 ± 0.2 | 44.0 ± 3 | 0 ± 3 | 21.5 ± 1 |
| Re—Ni | 139 ± 10 | 61.4 ± 1 | 0 ± 1 | 2.4 ± 0.2 | 27.4 ± 3 | 0 ± 3 | 7.9 ± 1 |

Table 2 shows the elemental analysis for a number of Re alloys useable as metal gate electrodes. Micro Rutherford back scattering ("RBS") analysis was used to estimate the alloy composition along with Atomic Force Microscopy ("AFM") which allows determination of film thickness. For a given quantity of charge, the thickness of Re—W and Re—C films were lower than that of Re and Re—Ni. This is because W and C reduce the efficiency of the deposition process. Also, when sodium citrate is used as a stabilizer in the bath, it is more difficult to reduce metal ions from the solution. However for Re—Ni, the film thickness is comparable to that of Re since both Ni and Re are deposited electrochemically.

TABLE 3

% Composition of Re Alloys

| | Re (%) | W (%) | Ni (%) | C (%) |
|---|---|---|---|---|
| Re—W | 93.5 | 6.5 | | |
| Re—Ni | 98.8 | | 1.2 | |
| Re—C | 95.7 | | | 4.3 |

Table 3 shows the % composition by weight of alloying compounds used with Re.

Example 1

Re—W Alloy Metal Gate Electrodes

A plating solution is prepared having 10 g/L ammonium perrhenate, 10 mL/L hydrochloric acid, 10 mL/L sodium citrate and 5 mL/L sodium tungstate, wherein the solution has a pH of about 3. In this plating solution, Re—W alloy is electroplated on Si/HfO$_2$ surface in the presence of light by passing 10 mA/cm$^2$ current for about 120 seconds.

Example 2

Re—Ni Alloy Metal Gate Electrodes

A plating solution is prepared having 10 g/L ammonium perrhenate, 10 mL/L hydrochloric acid and 10 g/L Nickel Chloride, wherein the solution has a pH of about 2.5. In this plating solution, Re—W alloy is electroplated on Si/HfO$_2$ surface in the presence of light by passing 10 mA/cm$^2$ current for about 120 seconds.

Example 3

Re—C Alloy Metal Gate Electrodes

A plating solution is prepared having 10 g/L ammonium perrhenate, 10 mL/L hydrochloric acid and 50 g/L Sodium citrate, wherein the solution has a pH of about 2. In this plating solution, Re—W alloy is electroplated on Si/HfO$_2$ surface in the presence of light by passing 10 mA/cm$^2$ current for about 120 seconds.

It is important to note that the construction and arrangement of the elements and methods provided herewith and in exemplary embodiments is illustrative only. Although only a few embodiments of the present disclosure have been described in detail, those skilled in the art will readily appreciate that many modifications are possible (e.g. variations in sizes, dimensions, structures, shapes and proportions of the various elements, values of parameters, mounting arrangements, use of materials, colors, orientation, etc.) without materially departing from the novel teachings and advantages of the subject matter recited in the claims. Accordingly, all such modifications are intended to be included within the scope of the present disclosure as defined in the appended claims. The order or sequence of any process or method steps may be varied or re-sequenced according to alternative embodiments. Other substitution, modification, changes and omissions may be made in the design, operating conditions and arrangement of the embodiments without departing from the spirit of the present disclosure as expressed in the appended claims.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

A strong acid is an acid that dissociates completely in an aqueous solution, or in other terms, with a $pK_a < -1.74$. This generally means that in aqueous solution at standard temperature and pressure, the concentration of hydronium ions is equal to the concentration of strong acid introduced to the solution. Strong acids include, for example, perchloric acid, hydroiodic acid, hydrobromic acid, hydrochloric acid, sulfuric acid and nitric acid.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

What is claimed as new and desired to be protected by Letters Patent of the United States is:

1. A metal gate electrode of a field-effect transistor comprising a metal selected from the group consisting of Re, Ru, Pt, Rh and combinations thereof, and a second compound selected from the group consisting of Ni, Y, Ti, Ta, W, C, Al and combinations thereof, wherein the second compound is present at about 0.1% to about 10% by weight and has been electrodeposited onto the metal, and wherein the work-function of the metal gate electrode is greater than or equal to the work-function of the metal or combination of metals calculated by the following formula $$\phi_m = 4.6 + V_{FB} \pm kT\ln\left(\frac{N_a}{n_i}\right)$$

such that,
$V_{FB}$ is flat band voltage; and
kT is 0.0259 eV.

2. The metal gate electrode of claim 1 wherein the second compound is W at a concentration from about 4% to about 9% by weight.

3. The metal gate electrode of claim 1 wherein the second compound is Ni at a concentration from about 0.1% to about 2.5% by weight.

4. The metal gate electrode of claim 1 wherein the second compound is carbon at a concentration from about 2% to about 6.5% by weight.

5. The metal gate electrode of claim 1, wherein the metal gate electrode is part of a complementary metal-oxide-semiconductor (CMOS).

6. The metal gate electrode of claim 1, wherein the metal is Re.

7. The metal gate electrode of claim 6, wherein the second compound is nickel.

8. A methods of making a stabilized metal gate electrode according to claim 1 comprising:
    forming a metal gate electrode pattern comprising a metal selected from the group consisting of Re, Ru, Pt, Rh, and combinations thereof and electrodepositing onto the metal a second compound selected from the group consisting of Ni, Y, Ti, Ta, W, C, Al, and combinations thereof; and
    subjecting the metal gate electrode pattern to a forming gas anneal.

9. The method of claim 8 wherein the second compound of the formed metal gate electrode is W at a concentration of about 4% to about 9% by weight.

10. The method of claim 8 wherein the second compound of the formed metal gate electrode is Ni at a concentration of about 0.1% to about 2.5% by weight.

11. The method of claim 8 wherein the second compound of the formed metal gate electrode is C at a concentration of about 2% to about 6.5% by weight.

12. The method of claim 8 wherein the second compound is W and the metal gate electrode pattern is formed by electrodeposition in a bath comprising about 1 g/L to about 50 g/L of a W salt.

13. The method of claim 8 wherein the second compound is Ni and the metal gate electrode pattern is formed by electrodeposition in a bath comprising about 1 g/L to about 100 g/L of a Ni salt.

14. The method of claim 8 wherein the second compound is C and the metal gate electrode pattern is formed by electrodeposition in a bath comprising about 1 g/L to about 500 g/L of sodium citrate.

* * * * *